US007979666B2

(12) United States Patent
Rixner et al.

(10) Patent No.: US 7,979,666 B2
(45) Date of Patent: Jul. 12, 2011

(54) SYSTEM AND METHOD FOR CONTEXT-INDEPENDENT CODES FOR OFF-CHIP INTERCONNECTS

(75) Inventors: Scott Rixner, Spring, TX (US); Kartik Mohanram, Houston, TX (US); Mihir R. Choudhury, Houston, TX (US)

(73) Assignee: William Marsh Rice University, Houston, TX (US)

( * ) Notice: Subject to any disclaimer, the term of this patent is extended or adjusted under 35 U.S.C. 154(b) by 704 days.

(21) Appl. No.: 11/953,028

(22) Filed: Dec. 8, 2007

(65) Prior Publication Data

US 2008/0140987 A1 Jun. 12, 2008

Related U.S. Application Data

(60) Provisional application No. 60/869,219, filed on Dec. 8, 2006.

(51) Int. Cl.
*G06F 13/00* (2006.01)
(52) U.S. Cl. ........................................ 711/202; 711/154
(58) Field of Classification Search .................. 711/154, 711/202
See application file for complete search history.

(56) References Cited

U.S. PATENT DOCUMENTS

| 6,696,993 | B2* | 2/2004 | Karczewicz | 341/67 |
| 2003/0048208 | A1* | 3/2003 | Karczewicz | 341/67 |
| 2007/0290901 | A1* | 12/2007 | Hekstra et al. | 341/95 |
| 2008/0219575 | A1* | 9/2008 | Wittenstein | 382/238 |
| 2008/0235560 | A1* | 9/2008 | Colmer et al. | 714/764 |

OTHER PUBLICATIONS

Rixner, "Memory Controller Optimizations for Web Servers," Proceedings of the 37th Int'l Symposium on Microarchitecture (MICTO-37'04).
Delaluz, V., Kandemir, M., Vijaykrishnan, N., Sivasubramaniam, A., Irwin, M. "DRAM energy management using software and hardware directed power mode control," Proceedings of the International Symposium on High-Performance Computer Architecture (2001).
Fan, X., Ellis, C., Lebeck, A., "Memory controller policies for dram power management," Proceedings of the International Symposium on Low Power Electronics and Design (2001).
Sotiriados, P., Chandrakasan, A., "Low Power Bus coding Techniques Considering Inter-wire Cpacitances," IEEE 2000 Custom Integrated Circuits Conference (2000).

(Continued)

*Primary Examiner* — Reba I. Elmore
(74) *Attorney, Agent, or Firm* — 24IP Law Group; Timothy R. DeWitt (57) ABSTRACT

A system and method for context-independent coding using frequency-based mapping schemes, sequence-based mapping schemes, memory trace-based mapping schemes, and/or transition statistics-based mapping schemes in order to reduce off-chip interconnect power consumption. State-of-the-art context-dependent, double-ended codes for processor-SDRAM off-chip interfaces require the transmitter and receiver (memory controller and SDRAM) to collaborate using the current and previously transmitted values to encode and decode data. In contrast, the memory controller can use a context-independent code to encode data stored in SDRAM and subsequently decode that data when it is retrieved, allowing the use of commodity memories. A single-ended, context-independent code is realized by assigning limited-weight codes using a frequency-based mapping technique. Experimental results show that such a code can reduce the power consumption of an uncoded off-chip interconnect by an average of 30% with less than a 0.1% degradation in performance.

15 Claims, 8 Drawing Sheets

OTHER PUBLICATIONS

Kulkarni, C., Catthoor, F., DeMan, H., "Code transformations for low power caching in embedded multimedia processors," Proceedings of the International Parallel Processing Symposium (1998).

Kulkarni, C., Miranda, M., Ghez, C., Catthoor, F., Man, H.D., "Cache conscious data layout organization for embedded multimedia applications," Proceedings of the Design and Test in Europe Conference. (2001).

Panda, P.R., Dutt, N.D., Nicolau, A., "On-chip vs. off-chip memory: the data partitioning problem in embedded processor-based systems," ACM Transactions on Design Automation of Electronic Systems 5 (2000) 682-704.

Benini, L., Macii, A., Poncino, M., Scarsi, R., "Architectures and synthesis algorithms for power-efficient bus interfaces," IEEE Trans. Computer-aided Design, vol. 19, No. 9, pp. 969-980 (2000).

Ramprasad, S., Shanbag, N.R., Hajj, I.N., "A coding framework for low power address and data buses," IEEE Transactions on VLSI Systems vol. 7 pp. 212-221 (Jun. 1999).

Deogun, H., Rao, R., Sylvester, D., and Blaauw, D., "Leakage-and Crosstalk-Aware Bus encoding for Total Power Reduction," DAC 2004, Jun. 7-11, 2004, San Diego, CA (2004).

Sotiriadis, P., Tarokh, V., Chandrakasan, A.P., "Energy reduction in VLSI computation modules: An information-theoretic approach," IEEE Transactions on Information Theory, vol. 49, pp. 790-808.

Stan, M.R. and Burleson, W.P., "Low-power encodings for global communication in CMOS VLSI," IEEE Transactions on VLSI Systems, vol. 5, No. 4 (1997).

Stan, M.R. and Burleson, W.P., "Bus invert coding for low power I/O," IEEE Transactions on VLSI Systems vol. 3, No. 1 pp. 49-58 (1995).

Benini, L., DeMicheli, G., Macii, E., Sciuto, D. and Silvano, C., "Asymptotic zero-transition activity encoding for address busses in low-power microprocessor-based systems," Proceedings of the Great Lakes Symposium on VLSI, pp. 77-82 (1997).

Musoll, E., Lang, T. and Cortadella, J., "Exploiting locality of memory references to reduce the address bus energy," Proceedings of the International Symposium on Low Power Electronics Design, pp. 202-207 (1997).

Yang, J., Gupta, R. and Zhang, C., "Frequent value encoding for low power data buses," ACM Trans. Des. Automation Electronic Systems, vol. 9, 354-384 (2004).

M. R. Guthaus et al., "MiBench: A free, commercially representative embedded benchmark suite," in IEEE Workshop on Workload Characterization, 2001.

M. Q. Do et al., "Parameterizable architecture-level SRAM power model using circuit-simulation backend for leakage calibration," in Proc. Intl. Symposium Quality Electronic Design, pp. 557-563, 2006.

Suresh, D., Agrawal, B., and Najjar, W., "A Tunable Bus Encoder for Off-Chip Buses," ISLPED '05, Aug. 8-10, 2005, San Diego, CA (2005).

Austin, T., Larson, E., Ernst, D.: SimpleScalar: An infrastructure for computer system modeling. IEEE Computer (2002).

Clark, L.T., Hoffman, E.J., Miller, J., Biyani, M., Liao, Y., Strazdus, S., Morrow, M., Velarde, K.E., mark A. Yarch: An embedded 32-b microprocessor core for low-power and high-performance applications. IEEE Journal of Solid-state Circuits 36 (2001) 1599-1608.

Yang, J., Gupta, R., "Frequent Value Locality and its Applications," ACM Transactions on Embedded Computing Systems, vol. 1, No. 1, Nov. 2002, pp. 79-105.

Wen, V., Whitney, M., Patel, Y. and Kubiatowicz, J. "Exploiting Prediction to Reduce Power on Buses,".

Basu, K., Choudhary, A., Pisharath, J., and Kandemir, M., "Power Protocol: Reducing Power Dissipation on Off-Chip Data Buses," Proceedings of the 35th Annual IEEE/ACM Int'l Symposium on Microarchitecture (MICRO-35)(2002).

Benini, L., Bruni, D., Macii, A., and Macii, E., "Hardware-Assisted Data Compression for Energy Minimization in Systems with Embedded Processors," Proceedings of the 2002 Design, Automation and Test in Europe Conference and Exhibition (2002).

Lekatsas, H., Henkel, J., and Wolf, W., "Code Compression for Los Power Embedded System Design," DAC 2000, Los Angeles, CA (2000).

Benini, L., Macii, A., Macii, E., and Poncino, M., "Selective Instruction Compression for Memory Energy Reduction in Embedded Systems," ISLPED99, San Diego, CA (1999).

Wolfe, A and Chanin, A., "Executing Compressed Programs on an Embedded RISC Architecture," IEEE (1992).

Liao, S., Devadas, S. and Keutzer, K., "Code Density Optimization for Embedded DSP Processors Using Data Compression Techniques," IEEE (1998).

* cited by examiner

SYSTEM AND METHOD FOR CONTEXT-INDEPENDENT CODES FOR OFF-CHIP INTERCONNECTS

CROSS-REFERENCE TO RELATED APPLICATIONS

The present application claims the benefit of the filing date of U.S. Provisional Application Ser. No. 60/869,219 entitled "System and Method for Context-Independent Codes for Off-Chip Interconnects" and filed on Dec. 8, 2006.

The above cross-referenced related application is hereby incorporated by reference herein in its entirety.

STATEMENT REGARDING FEDERALLY SPONSORED RESEARCH OR DEVELOPMENT

None.

BACKGROUND OF THE INVENTION

1. Field of the Invention

The present invention relates to interconnects between a processor and memory in a computer system, and more particularly, to a system and method providing reduced energy consumption by interconnects between a processor and memory in a computer system.

2. Brief Description of the Related Art

Modern embedded networking, video, and image processing systems are typically implemented as systems-on-a-chip (SoC) in order to reduce manufacturing costs and overall power and energy consumption. By integrating all of the peripheral functionality directly onto the same chip with the core microprocessor, both chip manufacturing and system integration costs can be lowered dramatically. In addition to cost, managing power and energy is a first order constraint that drives the design of embedded systems based on SoCs. However, most modern SoC-based embedded systems require more memory capacity than can reasonably be embedded into a single core. In such systems, the interconnects between the processor and external memory can consume as much or more power than the core itself. Even though the external memory and its associated interconnect are major contributors to the overall power dissipation in SoC-based embedded systems, such systems will continue to require the memory capacity afforded by external memory into the foreseeable future. Therefore, it is essential to develop advanced memory controller architectures that reduce the power dissipation of external memories and the interconnects between the embedded SoC core and the external memories.

Encoding data that is stored in memory can minimize the power consumed by the processor-memory interconnect. Dynamic power is consumed by the interconnect drivers when there are bit transitions. To minimize this power consumption, double-ended, context-dependent codes such as the bus-invert code have previously been proposed. Double-ended codes encode data at the transmitter and decode it at the receiver. For a processor-memory interconnect, this implies that the SDRAM also needs to participate in such codes. Context-dependent codes use the value last transmitted on the interconnect as well as the current data in order to encode the data to minimize transitions. For example, bus-invert coding either transmits the data value unchanged or its inverse, depending on which value minimizes transitions on the interconnect. If the SDRAM was modified to support such coding, bus-invert coding could reduce transitions on the interconnect by 22% on average.

Figure 1:
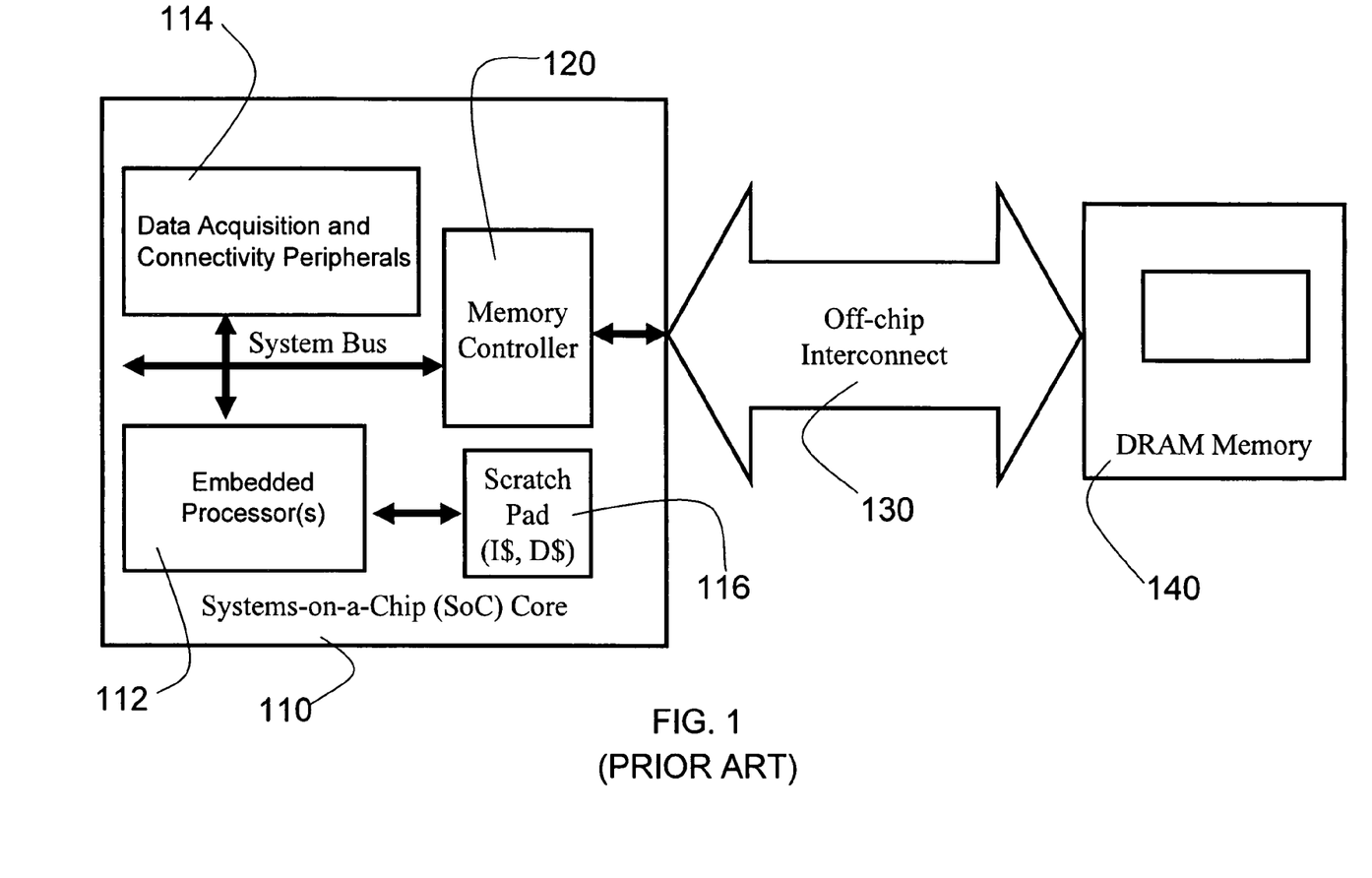
FIG. 1 is a block diagram of a typical SoC embedded system architecture.

The architecture of a modern SoC-based embedded system is presented in FIG. 1. The SoC core 110 has one or more simple processors 112 designed to provide enough computational capability for the application and integrated with some embedded memory, a variety of on-chip peripherals 114 for data acquisition and connectivity, a scratch pad 116 and memory controller 120. These systems also integrate SDRAM, since they frequently require more memory capacity—to buffer large data streams before either processing or forwarding them—than can reasonably be embedded into the SoC core.

Managing power dissipation and providing sufficient on-chip memory capacity are two major challenges in the design of such SoC-based embedded systems. The International Technology Roadmap for Semiconductors (ITRS) predicts that without significant architectural and design technology improvements, the power consumption of both high performance and low power SoC-based embedded systems will grow exponentially, easily exceeding power budgets (Edenfeld, D., Khang, A. B., Rodgers, M., Zorian, Y., "2003 technology roadmap for semiconductors," IEEE Computer (2004), International technology roadmap for semiconductors (2003)). Tethered embedded systems frequently have limited power budgets because of constraints on power delivery and cooling area available on peripheral buses. Mobile systems, in addition to requiring low power dissipation, are also constrained by battery life making energy consumption an important factor.

Currently, the power dissipation of representative low power and high performance embedded systems is divided roughly equally among the SoC 110, the memory interconnect 130, and the external memory 140. Furthermore, while high performance embedded systems can dissipate an order of magnitude more power than low power systems, the relative power dissipation of the SoC core 110, the interconnect 130, and the memory 140 remains similar. It is clear that in such systems, the external memory 140 and interconnect 130 can dissipate as much or more power than the SoC core 110. Thus, the memory system and the interconnect are candidates for techniques to reduce and manage power and energy.

Dynamic power is dissipated on a signal line of a bus whenever there is a transition on that line. A signal transition causes the drivers to actively change the value of the bus, which acts as a large capacitance. It is also possible for the drivers to dissipate static power when they hold the bus at either logical 0 or logical 1, depending on the design of the drivers. It is possible to limit this leakage power for the low frequencies of operation commonly found in embedded systems, so static power dissipation is typically dwarfed by the dynamic power dissipation of the bus drivers. However, there are still situations in which static power dissipation cannot be ignored, including higher frequencies of operation and when there are voltage mismatches between the core and the memory.

The techniques used to reduce power dissipation in external memory systems fall roughly into three categories: low-power memory modes, external memory access reduction, and double-ended techniques. Most modern commodity memories have one or more low power modes of operation. It may be expensive to enter and exit these modes, but frequently the memory dissipates an order of magnitude less power when it is in these modes. Several techniques, such as those proposed in Delaluz, V., Kandemir, M., Vijaykrishnan, N., Sivasubramaniam, A., Irwin, M. "DRAM energy management using software and hardware directed power mode control," Proceedings of the International Symposium on High-Performance Computer Architecture (2001) and Fan, X., Ellis, C., Lebeck, A., "Memory controller policies for dram power management," Proceedings of the International Symposium on Low Power Electronics and Design (2001), can be used to determine when external memory should be powered down to minimize power dissipation without disrupting performance. Another way to reduce the power dissipation of external memories is to access them less frequently. These techniques use some combination of on-chip memory, caching, and code reorganization to allow the processing core to reduce the number of external memory accesses. See Catthoor, F., Wuytack, S., DeGreef, E., Balasa, F., Nachtergaele, L., Vandecappelle, A., "Custom Memory Management Methodology: Exploration of Memory Organisation for Embedded Multimedia System Design," Kluwer Academic Publishers (1998); Kulkarni, C., Catthoor, F., DeMan, H., "Code transformations for low power caching in embedded multimedia processors," Proceedings of the International Parallel Processing Symposium (1998); Kulkarni, C., Miranda, M., Ghez, C., Catthoor, F., Man, H. D., "Cache conscious data layout organization for embedded multimedia applications," Proceedings of the Design and Test in Europe Conference. (2001); and Panda, P. R., Dutt, N. D., Nicolau, A., "On-chip vs. off-chip memory: the data partitioning problem in embedded processor-based systems," ACM Transactions on Design Automation of Electronic Systems 5 (2000) 682-704. In turn, this reduces the power demands of the external memory when it is active and can also allow it to be put to sleep more frequently. The final set of techniques for reducing the power dissipation of external memories requires cooperation between the memory controller 120 and the memory 140. These techniques either encode data to minimize power dissipation across the interconnect or transmit additional information to the memory to enable it to access the memory array more efficiently. See Benini, L., Macii, A., Poncino, M., Scarsi, R., "Architectures and synthesis algorithms for power-efficient bus interfaces," *IEEE Trans. Computer-aided Design*, vol. 19, No. 9, pp. 969-980 (2000); Ramprasad, S., Shanbag, N. R., Hajj, I. N., "A coding framework for low power address and data buses," *IEEE Transactions on VLSI Systems* vol. 7 pp. 212-221 (June 1999); Sotiriadis, P., Chandrakasan, A., "A bus energy model for deep sub-micron technology," *IEEE Transactions on VLSI Systems* vol. 10 pp. 341-350 (2002); Sotiriadis, P., Tarokh, V., Chandrakasan, A. P., "Energy reduction in VLSI computation modules: An information-theoretic approach," *IEEE Transactions on Information Theory*, vol. 49, pp. 790-808; and Stan, M. R. and Burleson, W. P., "Low-power encodings for global communication in CMOS VLSI," *IEEE Transactions on VLSI Systems*, vol. 5, no. 4 (1997)).

Figure 2:
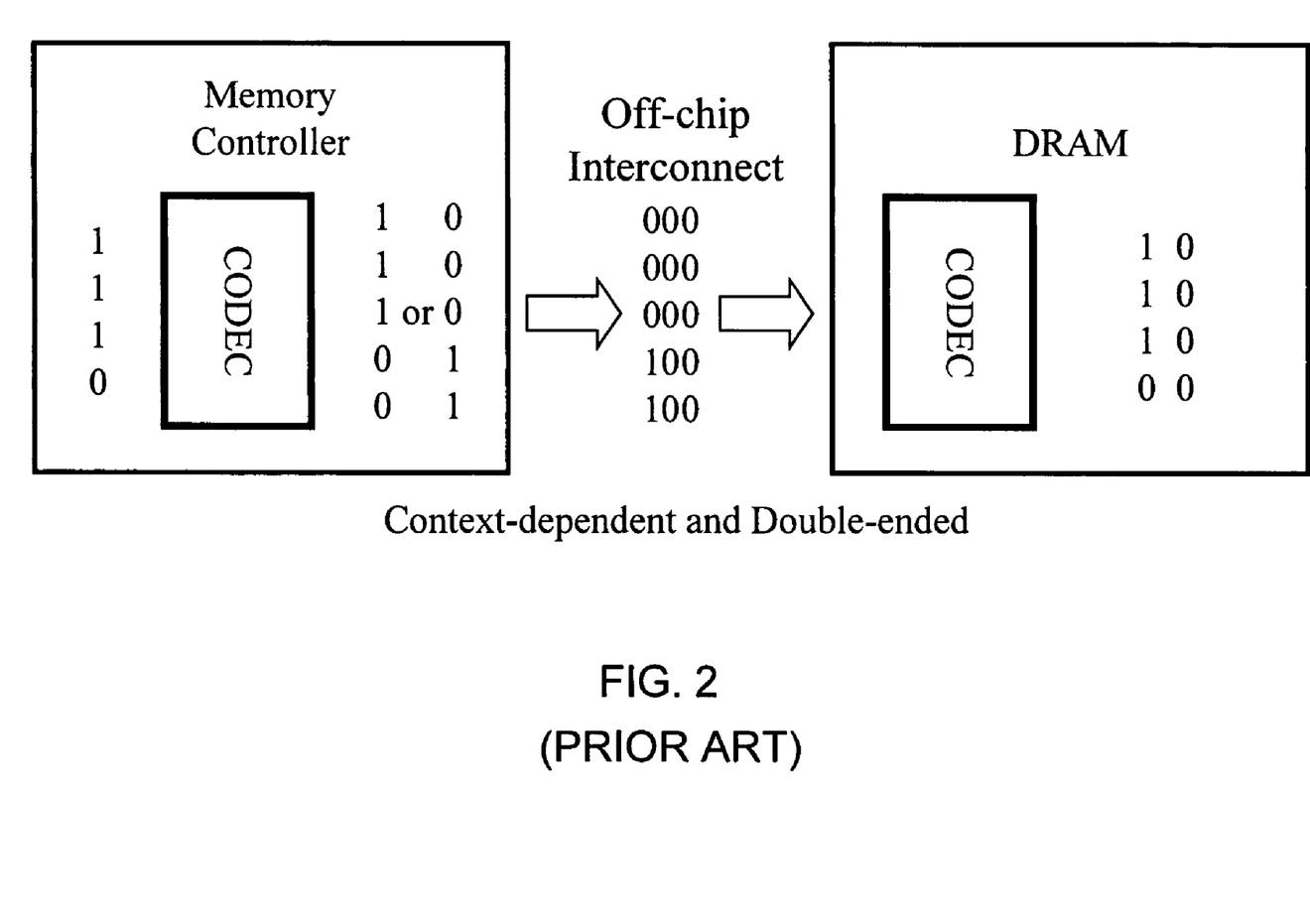
FIG. 2 is a diagram illustrating examples of coding used to reduce transitions.

The majority of data encoding schemes proposed in literature are not applicable to the off-chip interconnect 130 between an SoC 110 and external memory 140 because they are double-ended, context-dependent codes. Double-ended codes require collaboration between the transmitter and receiver to transfer encoded data. In such state-of-the-art codes, the transmitter (i.e., the memory controller on the SoC) uses a potentially complex handshaking protocol to communicate with the receiver (i.e., a decoder in the memory), which has the ability to interpret these handshakes to decode the transmitted data. The roles of the coder and the decoder would be reversed when communicating in the opposite direction (i.e., a memory read). Thus, as shown in FIG. 2, a potentially complex codec (coder-decoder) has to be present on both ends to successfully use these schemes. However, commodity SDRAMs do not have built-in codecs that are capable of communicating with the SoC core in this fashion.

Context-dependent coding schemes rely on inter-symbol correlation on successive data transfers to reduce power consumption. However, such schemes are not effective with commodity memory, as the memory cannot participate in the scheme. Therefore, any coding scheme using commodity memory must be able to unambiguously decode data read from the memory that was encoded when it was written to the memory. If inter-symbol correlation information is used when writing the data, then that information is not available upon reading the data, since there is no guarantee that data will be read in exactly the same order it is written. Some context-dependent coding schemes, such as those that use an XOR decorrelator, do not include enough information in the codeword to unambiguously recover the original data without the context information. However, other context-dependent schemes, such as bus-invert coding, produce code-words that can be decoded without context information. Even then, such schemes will only minimize power when writing to the memory, as the data will be read in a different context than it was written. Therefore, context-dependent codes are almost exclusively used in situations where both the transmitter and receiver can participate in the code. That way, the context information can be used to decode the transferred data before it is stored. If the data is retrieved later, it is re-encoded and transferred based on the context at that time.

The most popular and easy-to-implement double-ended context-dependent code reported in literature in the bus-invert code. See, Stan, M. R. and Burleson, W. P., "Bus invert coding for low power I/O," IEEE Transactions on VLSI Systems vol. 3, no. 1 pp. 49-58 (1995). The bus-invert code is a context-dependent, double-ended code since it computes the Hamming distance between the currently encoded data value on the bus and the next data value. If the Hamming distance exceeds $$\lceil \frac{n}{2} \rceil,$$

then the transmitter inverts the next value transmitted on the bus.

An additional line on the bus indicates whether the data is inverted or not, allowing the receiver to unambiguously decode the transmitted data. In this manner, an n-bit value can be transmitted over an n+1-bit bus with at most $$\left\lceil \frac{n+1}{2} \right\rceil$$

transitions. Without such coding, an n-bit value could cause as many as n transitions over an n-bit bus. For example, if the current value on the bus is 0000, and the next value to be transferred is 0001, then the Hamming distance between the values is 1. Therefore, 0001 will be transmitted over the bus with the invert bit set to 0, indicating the data is not inverted. However, if the current value on the bus is 1111 instead, the Hamming distance between the values is 3 and hence 1110 is transmitted with the invert bit set to 1. In this manner, each information symbol in the n-bit input space maps to two codewords. The code-word that minimizes switching activity on the interconnect is chosen for transmission to reduce power consumption. Bus-invert is thus not a one-to-one mapping, i.e., it is not a context-independent code. The bus-invert codewords for all the information symbols on a 4-bit wide data bus are shown in column 2 of Table 1.

TABLE I

Comparison of Different Codes

| Information Symbols | Bus-invert Coding [14] | 2-LWC Code [13] | Frequency (%) | Freq.-based remapping | Freq.-based 2-LWC | Freq. value coding [17] |
|---|---|---|---|---|---|---|
| 0000 | 0 0000<br>1 1111 | 0 0000 | 6.7 | 1001 | 0 0110 | 0 0000 |
| 0001 | 0 0001<br>1 1110 | 0 0001 | 5.6 | 0101 | 0 1010 | 0 0001 |
| 0010 | 0 0010<br>1 1101 | 0 0010 | 4.7 | 1011 | 1 1000 | 0 0010 |
| 0011 | 0 0011<br>1 1100 | 0 0011 | 6.9 | 1010 | 0 0011 | 0 0011 |
| 0100 | 0 0100<br>1 1011 | 0 0100 | 7.6 | 0100 | 0 0100 | 1 1000 |
| 0101 | 0 0101<br>1 1010 | 0 0101 | 7.0 | 1100 | 1 0000 | 0 0101 |
| 0110 | 0 0110<br>1 1001 | 0 0110 | 4.0 | 1101 | 1 0010 | 0 0110 |
| 0111 | 0 0111<br>1 1000 | 1 1000 | 8.1 | 0010 | 0 0010 | 1 0100 |
| 1000 | 0 1000<br>1 0111 | 0 1000 | 4.8 | 1110 | 0 1001 | 0 1000 |
| 1001 | 0 1001<br>1 0110 | 0 1001 | 8.4 | 0001 | 0 0001 | 1 0010 |
| 1010 | 0 1010<br>1 0101 | 0 1010 | 5.9 | 0011 | 0 1100 | 0 1010 |
| 1011 | 0 1011<br>1 0100 | 1 0100 | 4.0 | 0111 | 1 0100 | 0 1011 |
| 1100 | 0 1100<br>1 0011 | 0 1100 | 6.6 | 0110 | 0.0101 | 0 1100 |
| 1101 | 0 1101<br>1 0010 | 1 0010 | 8.5 | 0000 | 0 0000 | 1 0001 |
| 1110 | 0 1110<br>1 0001 | 1 0001 | 3.7 | 1111 | 1 0001 | 0 1110 |
| 1111 | 0 1111<br>1 0000 | 1 0000 | 7.5 | 1000 | 0 1000 | 0 1111 |

Many other context-dependent, double-ended codes have been proposed. One such code is based on the use of a decorrelator, which XOR's the data to be transmitted with the previous value transmitted across the bus. See Benini, L., DeMicheli, G., Macii, E., Sciuto, D. and Silvano, C., "Asymptotic zero-transition activity encoding for address busses in low-power microprocessor-based systems," Proceedings of the Great Lakes Symposium on VLSI, pp. 77-82 (1997) and Musoll, E., Lang, T. and Cortadella, J., "Exploiting locality of memory references to reduce the address bus energy," Proceedings of the International Symposium on Low Power Electronics Design, pp. 202-207 (1997). The receiver must then recover the actual value by undoing the XOR operation. Further reductions can be achieved by exploiting information about the frequency of occurrence of particular data values on the bus. In Yang, J., Gupta, R. and Zhang, C., "Frequent value encoding for low power data buses," ACM Trans. Des. Automation Electronic Systems, vol. 9, 354-384 (2004), a decorrelator was combined with a one-hot encoding of the 32 most frequently occurring values. Like bus-invert, such frequent value encoding is still a context-dependent, double-ended code because of the use of the decorrelator. The transmitter first decides if the data value is one of the most 32 frequently occurring values. If so, it is one-hot encoded. A one-hot code on a n-bit wide bus is a coding scheme where exactly one out of n bits is set to one. At the word-level, 32 codewords are available and hence 32 frequently occurring values can be encoded leaving the remaining values unencoded. (The reported code also ignores values 1-16 and performed equality tests before transmission, the details of which are excluded for brevity. Nevertheless, the table reflects the best scheme reported that includes some of these features.) Note that an additional bit is needed to indicate whether or not the data is one-hot encoded to the receiver. The result of one-hot encoding is then passed through the decorrelator prior to transmission across the bus. The receiver must recover the actual value by undoing the XOR and one-hot encoding transformations. The final column of Table 1 shows the one-hot codeword assignments, based on the frequency distribution in column 4, for frequent value coding on a 4-bit wide data bus. Note that only 4 most frequently occurring values (1101, 1001, 0111, 0100) are one-hot encoded. In practice, these values would also be XOR'ed with the previous value transmitted across the bus by the decorrelator. Like bus-invert, frequent value encoding does not use a one-to-one mapping, as a particular data value can be mapped to many encoded values depending on the previous data transmitted across the bus.

SUMMARY OF THE INVENTION

Single-ended, context-independent codes are much simpler to implement than prior codes, as they do not require modifications to the SDRAM. The present invention introduces the concept of frequency-based, single-ended, context-independent codes for interconnect power reduction. The simplest frequency-based code simply remaps the input space based upon the measured or expected frequency of occurrence of each data value. Despite the fact that such a code is context-independent, and so does not account for possible switching on the interconnect, it is able to reduce the transitions on the interconnect by 28% on average. This simple code results in a larger power decrease on the interconnect than context-dependent bus-invert codes that are explicitly designed to minimize switching activity. Furthermore, frequency-based coding can also be used to augment limited-weight codes (LWCs). A limited-weight code maps the input data to a wider codeword in which the number of ones in the word is restricted. The proposed frequency-based assignment of codewords using a LWC can reduce transitions on the interconnect by an average of 30% over the uncoded case.

Frequency-based context-independent codes reduce interconnect power consumption without requiring the use of specialized SDRAM. Frequency-based codes are effective because frequently occurring values usually follow either themselves or other frequently occurring values on the interconnect. So, if the most frequently occurring values are all mapped to codewords that are close (Hamming distance-based) to each other, then switching activity can be minimized. In this manner frequency-based codes simply, but effectively, reduce dynamic power consumption on interconnects to commodity SDRAM.

In a preferred embodiment, the present invention is a single-ended, limited-weight code for interconnect energy reduction. These single-ended codes can be used in modern embedded systems with commodity memory, yet are still able to achieve significant reductions in energy consumption of the processor-memory interconnect. In the proposed codes, codeword generation is separated from code-word assignment. The generated codewords are limited-weight codewords. A limited-weight code (LWC) minimizes the weight of the codewords by increasing the size of the code space and selecting the codewords from that space that have the least Hamming weight (the number of ones in the codeword). As initially proposed, such LWCs can be used with a trivial assignment strategy to implement a single-ended, context-independent code. However, using such an assignment, LWCs only modestly reduce the number of transitions on the interconnect compared to state-of-the-art codes. The present invention introduces a trace-based assignment strategy for the limited-weight codewords that is able to reduce the transitions on the interconnect as much or more than state-of-the-art double-ended, context-dependent codes without requiring the participation of the memory.

The trace-based assignment strategy exploits frequency and sequence information from memory traces collected on the target system. Previously proposed frequency-based codes have all been double-ended. A key observation of this work is that the appropriate use of frequency information can result in significant reduction in switching activity on the interconnect without the need to resort to a double-ended coding scheme. Furthermore, the additional use of sequence information during codeword assignment can lead to even greater reduction in switching activity on the interconnect. In fact, a sequence-based assignment of limited-weight codewords yields a 42.5% reduction in switching activity with a single-ended code. This beats one of the best previously proposed double-ended, frequency-based codes, which is only able to achieve a 38.7% reduction in switching activity.

In a preferred embodiment, the present invention is a method for controlling commodity memory. The method comprises the steps of generating a set of codewords, assigning a unique codeword from the set of codewords to each information symbol in a set of information symbols using context independent single-ended mapping, and encoding/decoding information symbols to codewords using this mapping in a memory controller. The assigning of codewords may be based upon memory traces from a system and may be determined by frequency-based metrics and/or sequence-based metrics applied to the memory traces. The codewords may be limited-weight codewords. The frequency-based metrics may comprise encoding information symbols with the highest frequency of occurrence to the least-weight codewords. The sequence-based metrics may comprise encoding information symbols that most frequently occur in sequence to the least-weight codewords that are also separated by the minimum Hamming distance. In another embodiment, the present invention is a memory controller for controlling commodity memory. The memory controller comprises a context-independent encoder, a context-independent decoder, and a memory queue for providing data from the context-independent encoder to the commodity memory. The context-independent encoder encodes information symbols into codewords using a context-independent single-ended mapping and provides encoded data to the memory queue and the context-independent decoder decodes codewords received from the commodity memory that previously were encoded by the context-independent encoder. The codewords may be limited-weight codewords generated using frequency-based metrics. The frequency-based metrics may be determined using memory traces from a system. In another embodiment, the codewords are limited-weight codewords generated using sequence-based metrics. The sequence-based metrics are determined using memory traces from a system.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which:

FIGS. 6(a) and (b) are graphs of the frequency of the top 256 Byte and Word values in a preferred embodiment of the present invention.

DETAILED DESCRIPTION OF THE PREFERRED EMBODIMENTS

The present invention introduces and develops a class of context-independent, single-ended coding schemes for embedded applications. These coding schemes are split into two phases. During the first phase, a set of codewords is generated. In the second phase, each information symbol is assigned to a unique codeword. These assignments are determined purely by frequency-based metrics without using any local context information. Such codes have several advantages. First, they significantly lower power consumption on the interconnect between the SoC and the memory modules. Second, they are single-ended, i.e., they do not require the SDRAM to participate in the coding-decoding process. A codec is only required in the memory controller on the SoC. Last, they have negligible impact on performance during the coding-decoding process.

Limited-Weight Codes (LWCS)

One class of context independent codes that meet all the above requirements are limited-weight codes (LWCs). Consider a k-bit wide data bus with $2^k$ information symbols. An m-LWC is a one-to-one mapping where every word in the $2^k$ input space maps to a codeword such that the Hamming weight, i.e., the number of ones in the codeword, is less than or equal to m. Since the source entropy must remain unchanged, i.e., since every information symbol must have a unique codeword, the following inequality must be satisfied by all m-LWCs:

$$\binom{n}{0} + \binom{n}{1} + \binom{n}{2} + \ldots + \binom{n}{m} \geq 2^k \quad (1)$$

Here, n is the minimum number of bits (m≦n) such that the inequality is satisfied, i.e., n determines the width of the bus needed to implement a m-LWC. Note that the inequality is only satisfied when n≧k. A perfect m-LWC satisfies Equation 1 above with equality, i.e., all the codewords of length n with weight less than or equal to m are used in the mapping. For example, a 4-LWC where k equals 8 is a perfect 4-LWC when the codeword bus width n equals 9. In another example, an 8-LWC where k equals 8 includes the same codewords as the input space, but they can be potentially reassigned to reduce energy consumption on the processor-memory interconnect. The information symbols and the corresponding codewords for the perfect 2-LWC when k equals 4, obtained using the generation technique presented in, are presented in columns 1 and 3 respectively in Table 1.

Frequency-Based Codes

Frequency-based codes are a class of codes where a context-independent mapping between information symbols and codewords is achieved by assigning information symbols that have the highest probability of occurrence to codewords with minimum weight. One way to use frequency would be to one-hot encode a small set of frequently occurring values at the word-level to achieve power savings. However, such an approach does not use the codeword space efficiently since only 32 out of $2^{32}$ values can actually be encoded by this scheme.

A more efficient way to use frequency is to remap information symbols to be transmitted on the n-bit wide bus to codewords on a n-bit wide bus, i.e., through a permutation. Such a remapping can be statically determined by an analysis of several traces in the application space. The frequency distribution of information symbols from each application could be used for that application, or the frequency distributions for a set of applications could be combined to produce a global frequency distribution. The information symbols are then ranked in descending order of frequency of occurrence, and remapped to codewords in increasing order of weight. Thus, the information symbol that occurs most frequently on the bus is remapped to the codeword with the least weight. In practice, such a remapping would have to occur at the byte-level since word-level remapping is impractical.

The frequency distribution given in Table 1 can be used to perform such a remapping of the information symbols in the table. The information symbols and the corresponding codewords for a frequency-based remapping of the 4-bit information space are presented in columns 1 and 5 respectively in Table 1. The frequency distribution used to generate this remapping is presented in column 4 in the same table. For example, the most frequently occurring information symbol, 1101, would be remapped to 0000.

Frequency-Based m-LWCs

The biggest handicap of m-LWCs is that the one-to-one mapping is statically determined without any knowledge of the characteristics of the input space. The present invention combines the advantages of frequency-based codes with LWCs to produce a context-independent single-ended mapping. By combining m-LWCs with frequency-based coding, the distribution of information symbols is analyzed to produce a context-independent mapping that, while statically determined, exploits an a priori knowledge of the distribution of information symbols. Frequency-based m-LWCs thus leverage the advantages of both frequency-based coding and limited-weight coding. It is a departure from conventional types of codes that seek to explicitly minimize transitions using the state of the bus. The generation of the codewords is separated from the mapping process, and the best of both techniques is harnessed to realize practical context-independent single-ended codes.

The frequency-based mapping encodes information symbols with the highest frequency of occurrence to LWC codewords with the least weight. A simple frequency-based mapping from a 2-LWC to a 4-bit information space, using the frequency distribution in column 4 of Table 1 is presented in column 6 of the same table.

Figure 3:
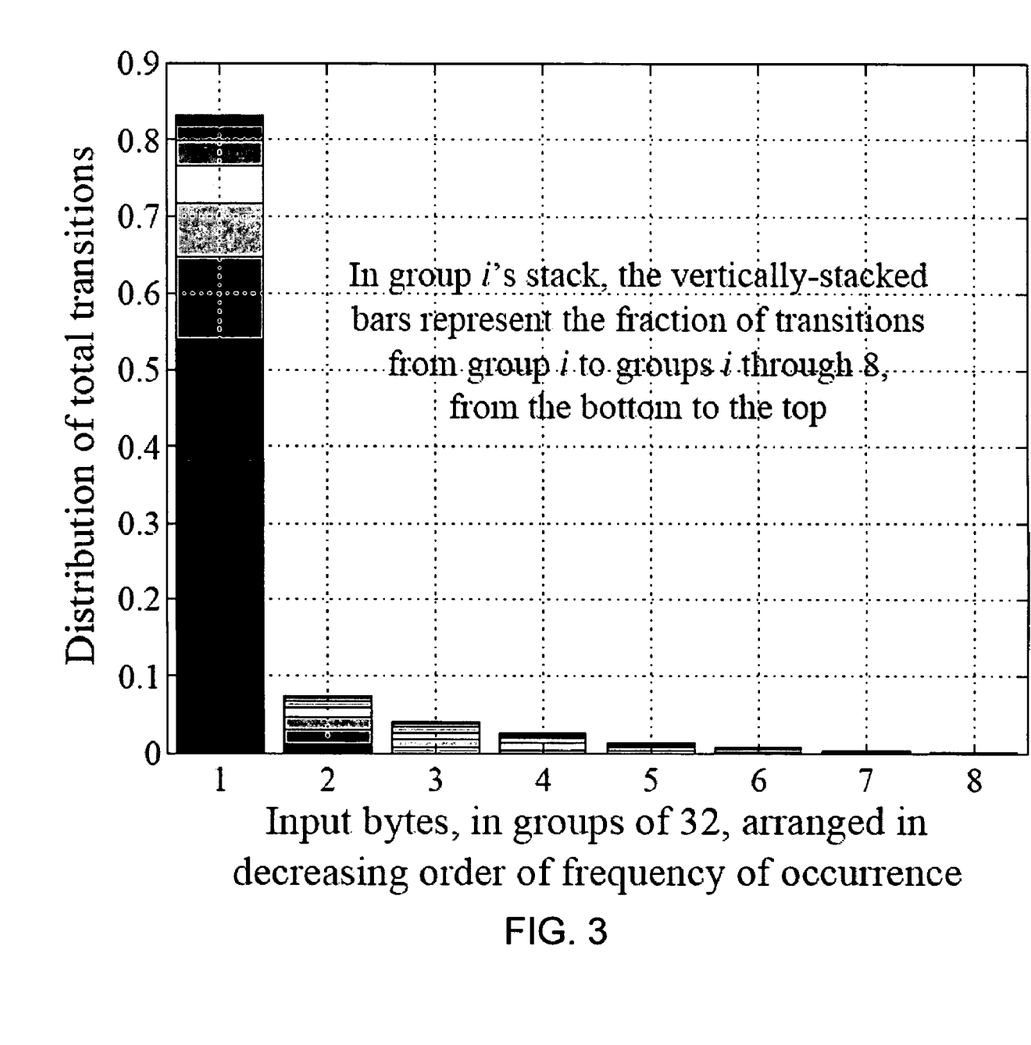
FIG. 3 is a diagram illustrating various aspects of sequence-based coding.

FIG. 3 shows the frequency of transitions between bytes as a function of the frequency of occurrence of the bytes. The 256 8-bit information symbols are arranged in 8 groups of 32 symbols each in decreasing order of frequency of occurrence. For example, group 1 contains the 32 most frequently occurring bytes and group 8 contains the 32 least frequently occurring bytes. Along the y-axis, the vertically stacked bars represent the fraction of the transitions that occur between a symbol in group i and a symbol in group j, where j≧i. From the figure, it is clear that approximately 38% of the transitions are completely contained within group 1 of the 32 most frequently occurring bytes. However, it is surprising that 45% of the transitions also occur between bytes in group 1 and bytes in the remaining groups. Indeed, the number of transitions that occur between a byte in group 1 and a byte in group 2 (second bar from the bottom in the group 1 bar) is nearly an order of magnitude greater than transitions that are completely contained between bytes in group 2 (bottom bar in the group 2 bar). This is a very strong observation that motivates codeword assignments for bytes in groups 2 through 8 that reduce the Hamming distance to the codewords assigned to bytes in group 1. This is, however, not addressed in frequency-based assignment, since the codewords are ranked in ascending order of their weights and assigned to information symbols ranked in descending order of frequency of occurrence. As a result, frequency-based assignment minimizes the Hamming distance between codewords assigned to bytes in a group, at the expense of the Hamming distance between codewords assigned to bytes across groups.

Coding for Commodity Memories

This section develops a class of context-independent, single-ended coding schemes for embedded applications. These coding schemes are split into two phases. During the first phase, a set of codewords is generated. In the second phase, each information symbol is assigned a unique codeword. These assignments are determined purely by frequency-based and sequence-based metrics without using any run-time context information. Such codes have several advantages. First, they significantly lower energy consumption on the interconnect between the SoC and the memory modules. Second, they are single-ended, i.e., they do not require the memory to participate in the coding-decoding process. A codec is only required in the memory controller on the SoC. Last, the coding-decoding process has a negligible impact on performance.

Codeword Generation

Limited-weight codes (LWCs) provide an effective set of codewords that minimize the number of ones in each codeword. LWCs are single-ended, context-independent codes.

Tracebased Assignment

Most coding techniques use context information to assign codewords in order to minimize transitions. However, single-ended codes require the assignment to be independent of the current context. This can be done with no a priori information about the memory behavior of the system, as in the originally proposed limited-weight code. In contrast, this embodiment assigns codewords based on an analysis of memory traces taken from the system.

Figure 5:
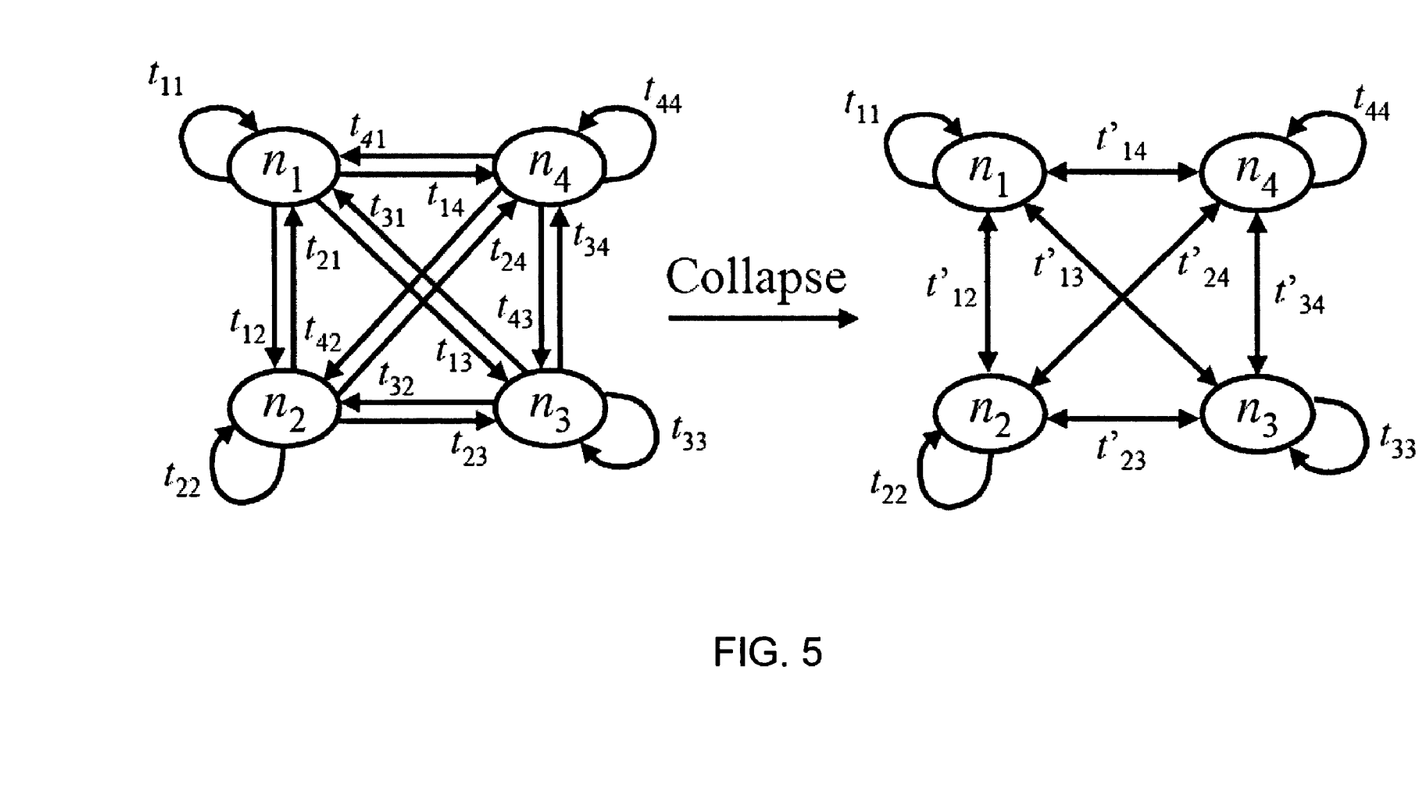
FIG. 5 is a graphical representation of trace information in accordance with a preferred embodiment of the present invention.

Two important sets of information can be collected from a memory trace: the frequency of occurrence of each value, i, that crosses the interconnect ($f_i$) and the frequency with which each value, i, that crosses the interconnect is followed by every other value, j ($t_{ij}$). This information can be represented by a graph, as shown in FIG. 5. Each node in the graph represents a single data value, i. The weight of i is the frequency of occurrence of that data value, $f_i$. Each node, i, is also connected to every other node, j, including itself, with a directed edge. The weight of an edge from node i to node j is the frequency with which the data value j follows the data value i over the interconnect, tij. Since the same number of bit transitions will occur regardless of the order in which two values cross the interconnect, the two directed edges that connect each pair of nodes can be collapsed into a single edge whose weight is the sum of the two directed edges, $t'_{ij}$:

$$t'_{ij} = t'_{ji} = t_{ij} + t_{ji} \forall i \neq j \quad (2)$$

Note that the frequency of occurrence of each value is then related to the transition frequencies in the following way:

$$f_i = \sum_j t_{ij} = t_{ii} + \frac{1}{2}\sum_{j \neq i} t'_{ij} \quad (3)$$

Note that $\Sigma_{j \neq i} t'_{ij}$ is halved because $t'_{ij}$ includes all the edges that both enter and leave node i, and each occurrence of i is accompanied by both an entrance and an exit from i. This graph can then be used to assign codewords in a variety of ways. The use of the node weights to perform frequency-based assignment and the edge weights to perform sequence-based assignment are discussed below.

Frequency-Based Assignment

Figure 6:
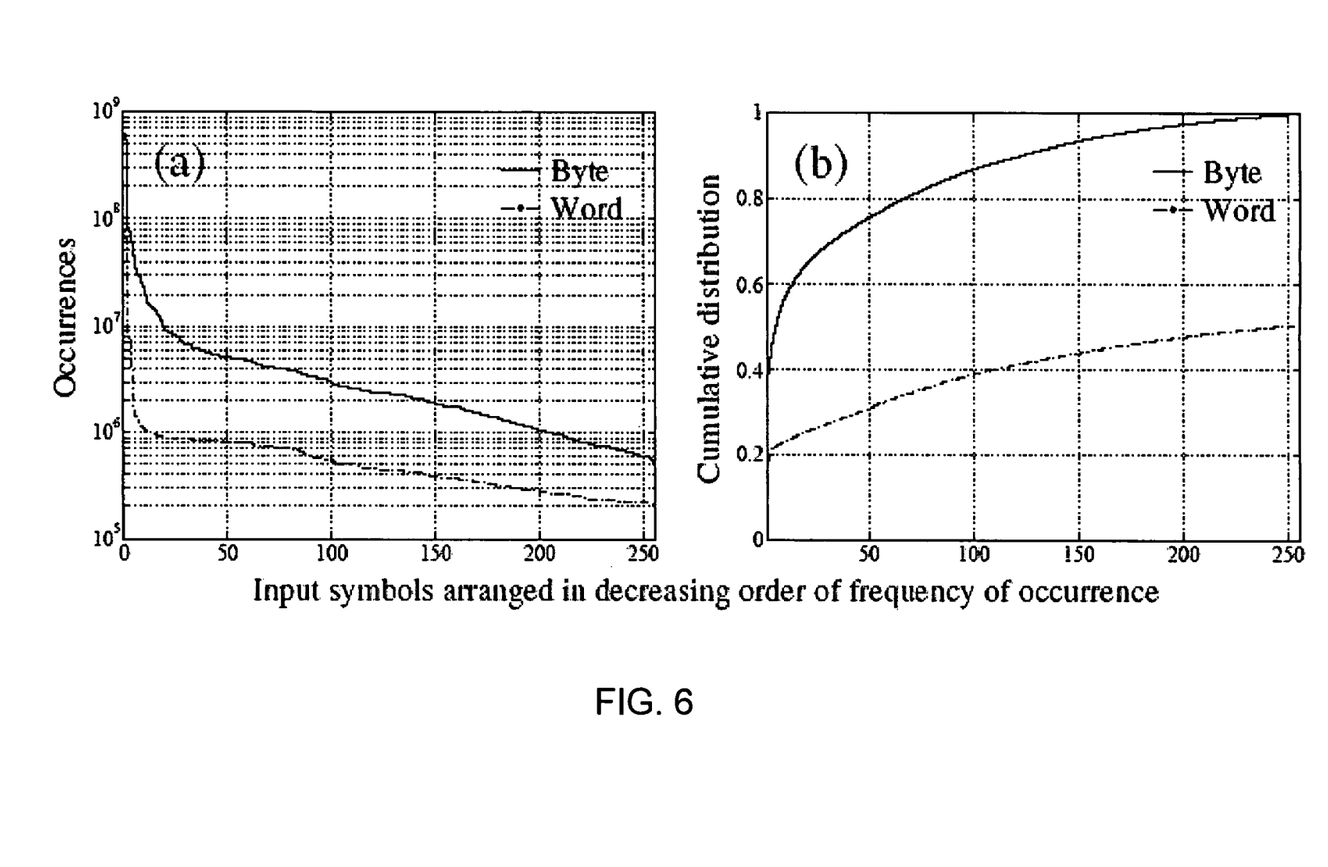

The set of codewords can be assigned to information symbols based on the frequency of occurrence of each information symbol. Several previously proposed codes have performed such frequency-based assignment, although they have used different code generation techniques. For example, frequent value coding uses one-hot encoding of the 32 most frequently occurring 32-bit values. Since most of the values remain uncoded, frequent value coding also uses a decorrelator to reduce switching activity using context information. Indeed, simulation results on single ended versions (without the decorrelator) of such word-level frequent value coding schemes indicate that their performance is inferior to that of simple coding schemes such as bus-invert. The reasons for this inefficiency, as well as opportunities for further improvement, are best explained by studying the frequency of occurrence of the 256 most frequently occurring word and byte values across the MiBench embedded benchmark suite (M. R. Guthaus et al., "MiBench: A free, commercially representative embedded benchmark suite," in *IEEE Workshop on Workload Characterization*, 2001.) presented in FIG. 6.

As FIG. 6(a) shows, the top 3 32-bit words occur in orders of magnitude more frequently than other values on the processor-memory interconnect. However, as the figure also shows, the remaining values in the top 256 frequently occurring words continue to have a relatively high frequency of occurrence that does not drop off dramatically. For instance, the 10th most frequently occurring value only occurs only 5 times as often as the 256th most frequently occurring value. These remaining words are likely to be significant contributors to the switching activity on the interconnect. This is further illustrated in FIG. 6(b), where the cumulative distribution of the top 256 most frequently occurring 32-bits words only accounts for approximately 50% of the values on the processor-memory interconnect. Given that so many different word values cross the interconnect, it is impractical to encode them all efficiently. For example, FIG. 6(b) shows that frequent-value coding would only encode 27.6% of the interconnect traffic by one-hot encoding the 32 most frequently occurring values.

It is far more practical to code at the byte level, since there are only 256 possible values. Furthermore, similar to the word-level, the most frequently occurring byte appears an order of magnitude more frequently than other bytes on the processor-memory interconnect. Although the drop-off in frequency is a little less rapid than at the word-level, the 200 least frequently occurring byte values still have surprisingly similar frequencies of occurrence. The relatively slow drop-off in frequency of occurrence suggests that a code that remaps all information symbols to limited-weight codewords will be effective and practical to implement in hardware.

A frequency-based, limited-weight code exploits this frequency distribution by ordering the information symbols by decreasing frequency of occurrence, $f_i$. Each information symbol is then assigned, in order, to the LWC codeword with the least weight that remains. The use of an 8-LWC allows a simple remapping in which information symbols are reassigned based on their frequency of occurrence. The use of a 4-LWC can be more effective, as the weight of the codewords is reduced. Such a 4-LWC would map the 46

$$\left(\binom{9}{0} + \binom{9}{1} + \binom{9}{2}\right)$$

most frequently occurring byte values (which account for 74% of all bytes transferred over the interconnect) to 9-bit codewords with 2 or fewer ones in the codeword. The remaining 26% of the bytes transferred over the interconnect would be mapped to 9-bit codewords with only 3 or 4 ones in the codeword. Such a code will result in a dramatic decrease in ones transferred over the interconnect, which will increase the probability of transferring consecutive zeros across any given wire. Therefore, interconnect values will tend to remain at zero, reducing the overall number of transitions.

Figure 7:
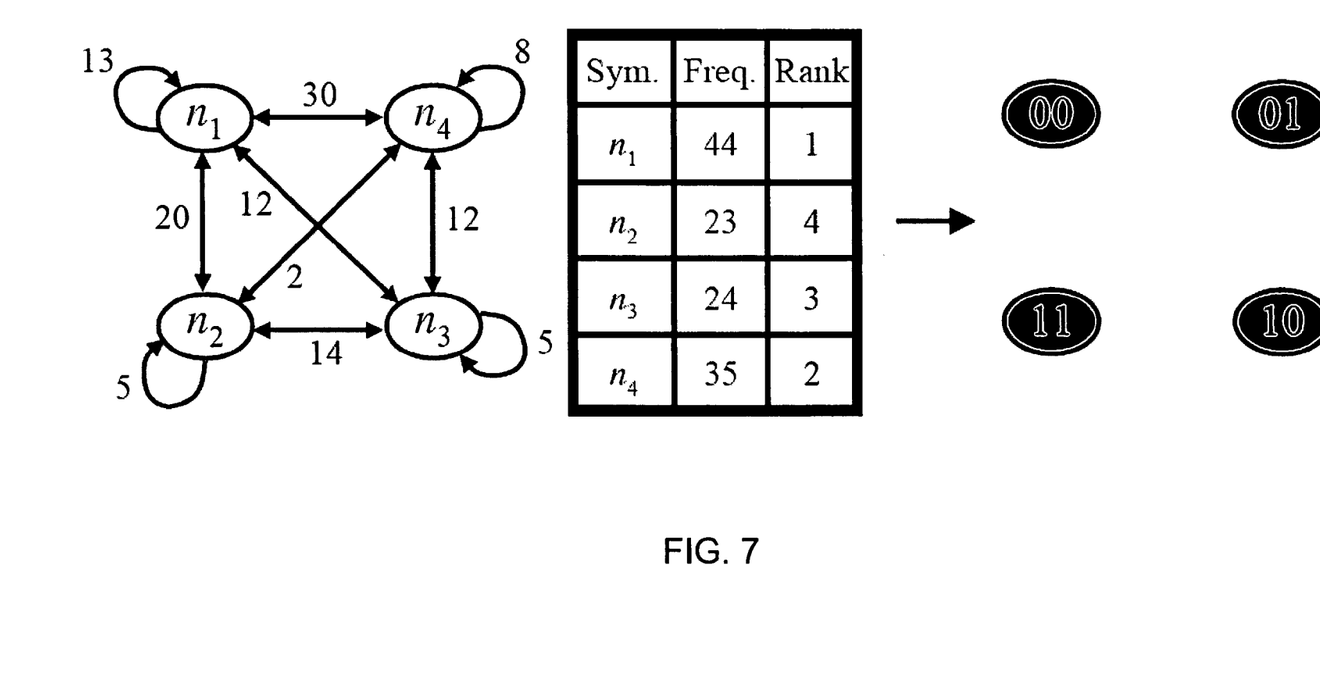
FIG. 7 is a diagram illustrating frequency-based assignment in accordance with a preferred embodiment of the present invention.

Frequency-based remapping is illustrated with an example shown in FIG. 7. There are 4 nodes $n_1 \ldots n_4$ in the graph and the code-space consists of all 2-bit codewords, i.e., a 2-LWC where n=2. The second column of the table in the figure shows the frequency of occurrence, $f_i$, of each value, and the third column ranks the nodes in descending order of $f_i$. Based upon this, the nodes are processed in the order $n_1$, $n_4$, $n_3$, and $n_2$ and the assigned codewords are illustrated in the resulting graph with shaded nodes. The expected number of bit transitions for this assignment of codewords, if the relative frequency of occurrence remains unchanged, is 122.

Sequence-Based Assignment

The set of codewords can also be assigned to information symbols based on the sequence in which they occur. Specifically, the frequency with which pairs of values follow each other on the interconnect can be used to ensure that pairs of values that follow each other frequently will be assigned codewords that are close to each other (i.e., have a small Hamming distance between them). Similarly, pairs of values that do not follow each other very frequently can be assigned codewords that are not close to each other.

Figure 8:
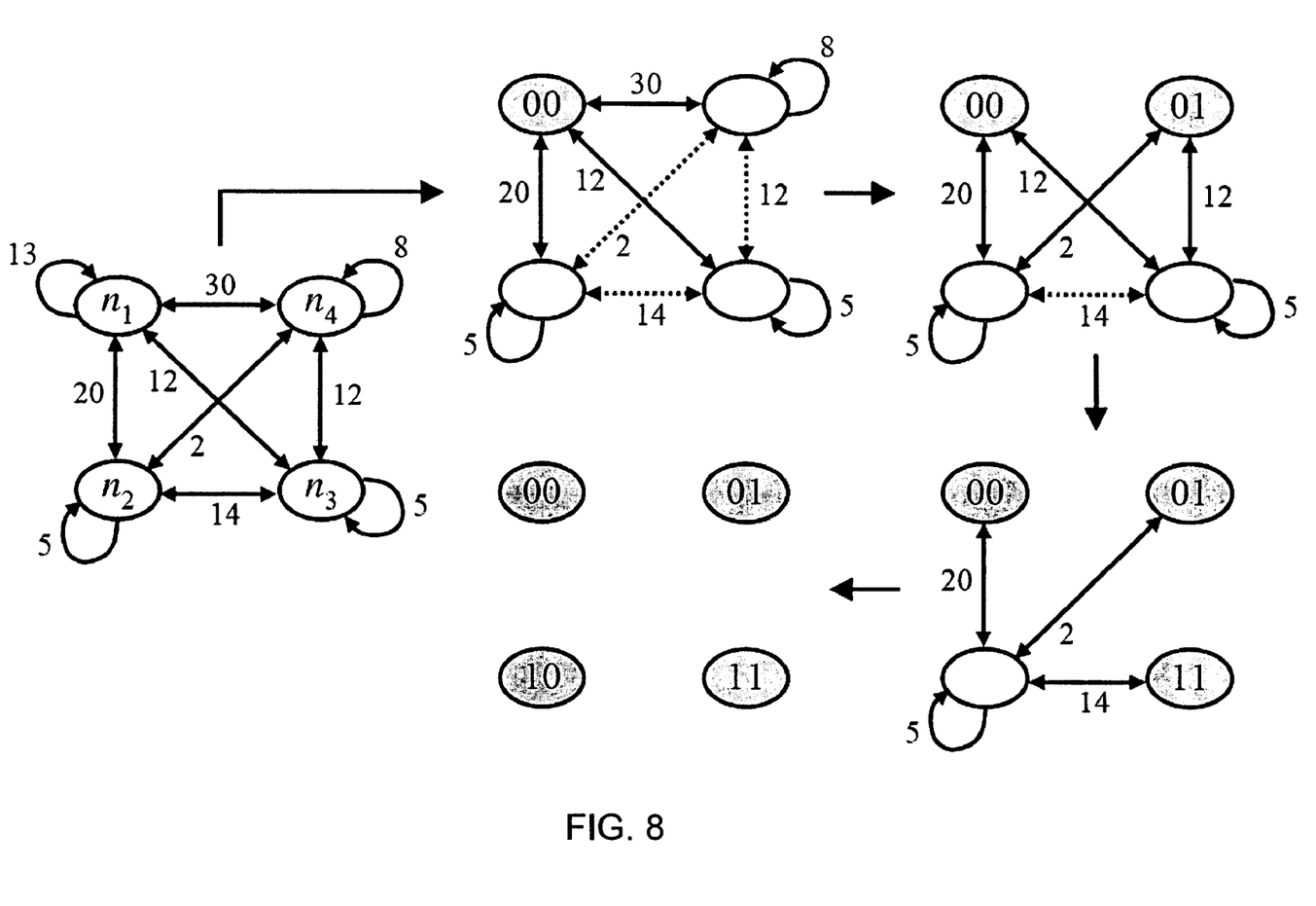
FIG. 8 illustrates an example for sequence-based assignment in accordance with a preferred embodiment of the present invention.

FIG. 8 shows the frequency of transitions between bytes as a function of the frequency of occurrence of the bytes. The 256 8-bit information symbols are arranged in 8 groups of 2 symbols each in decreasing order of frequency of occurrence. For example, group 1 contains the 32 most frequently occurring bytes and group 8 contains the 32 least frequently occurring bytes. Along the y-axis, the vertically stacked bars represent the fraction of the transitions that occur from a symbol in group i to a symbol in group j, where $j \geq i$. From the figure, it is clear that approximately 38% of the transitions are completely contained within group 1 of the 32 most frequently occurring bytes. However, it is surprising that 45% of the transitions also occur between bytes from group 1 and bytes from the remaining groups. Indeed, the number of transitions that occur from a byte in group 1 to a byte in group 2 (second bar from the bottom in the group 1 bar) is nearly an order of magnitude greater than transitions that are completely contained between bytes in group 2 (bottom bar in the group 2 bar). This is a very strong observation that motivates codeword assignments for bytes in groups 2 through 8 that reduce the Hamming distance to the codewords assigned to bytes in group 1. This is, however, not addressed in frequency-based assignment, since the codewords are ranked in ascending order of their weights and assigned to information symbols ranked in descending order of frequency of occurrence. As a result, frequency-based assignment minimizes the Hamming distance between codewords assigned to bytes in a group at the expense of the Hamming distance of the codewords assigned to bytes across groups. The rest of this section describes sequence-based codeword assignment that utilizes transition frequency distribution between pairs of bytes across groups to minimize the Hamming distance of their codeword assignments.

From the diagram in FIG. 5, sequence-based assignment is formally equivalent to the minimization of the following objective function:

$$\sum_{i=1}^{256} \sum_{j=s+1}^{256} (\text{code}[i] \oplus \text{code}[j]) t'_{ij} \quad (4)$$

where code[i] and code[j] are the codewords assigned to information symbols i and j respectively and $t'_{ij}$ is the cumulative frequency of occurrence of the sequence i->j/j->i. This problem is intractable and belongs to the class of NP-hard problems.

In practice, however, such problems respond fairly well to heuristics that proceed with assignments to information symbols one-at-a-time. The linear pass heuristic algorithm shown below was developed to solve this problem as follows.

---

C - set of generated codewords, e.g., 8-LWC, 4-LWC for assignment
U - set of information symbols with no codeword assignment
A - set of information symbols with assigned codewords
    U ← {all nodes in subject graph}
initialize n ← $\max_{i \in U} (f_i)$, i.e., n is the most frequent node
    code[n] ← 0; C ← C\{0}; U ← U\{n}; A ← {n}
while U ≠ φ do
    n ← $\max_{i \in U} (\Sigma_{j \in A} t'_{ij})$
    code[n] ← $\min_{c \in C} (\Sigma_{j \in A} (c \oplus \text{code}[j]) t'_{nj})$
    C ← C\{code[n]}; U ← U\{n}; A ← A∪{n}

---

The central idea is to proceed by making codeword assignments to nodes, i.e., information symbols, one-at-a-time in the subject graph. All nodes begin in the set of unassigned nodes, U. Once a codeword assignment is determined for a node, that node is transferred to the set of assigned nodes, A. The first symbol to be assigned a codeword is the most frequently occurring byte. Although the first codeword can be randomly assigned, 0 is chosen for simplicity. On each subsequent pass, the node, n, with the maximum sum of transition frequencies to A given by $\Sigma_{j \in A} t'_{nj}$ is chosen for codeword assignment. Ties are broken by selecting the n with higher frequency of occurrence, fn. The codeword, c, is chosen such that it has the minimum cumulative weighted Hamming distance to the nodes in A. The weighted Hamming distance of the codeword c to node j ∈ A is the Hamming distance between c and code[j] weighted by the corresponding $t'_{ij}$. By summing over all j ∈ A, the cumulative weighted Hamming distance of c to A is determined. The search for the codeword that minimizes the cumulative weighted Hamming distance is exhaustive over the pool of unassigned codewords. Once a codeword is assigned to n, it is moved from U to A. The updates are performed as indicated in the pseudo-code, and a new node, n, is chosen for codeword assignment on the next pass.

The heuristic is illustrated with an example shown in FIG. 8, starting with the same diagram as FIG. 7. There are 4 nodes in the diagram and the code-space consists of all 2-bit codewords. Each diagram in FIG. 8 represents one pass through the algorithm shown above. The shaded nodes belong to the set of assigned nodes, A, and the unshaded nodes belong to the set of unassigned nodes, U. At each step, the solid edges are edges that are considered in selecting the next node, n, and the dashed edges are ignored at that step, but will be used in future steps. For clarity, edges that are no longer needed are removed from each graph. The set of assigned nodes, A, is initialized to the most frequently occurring node $n_1$, which is assigned the codeword 00, as shown in the upper left of FIG. 8. The weights of the edges between the remaining nodes and A are used to select node $n_4$, which has the maximum weight to A. This node is assigned a codeword that minimizes its cumulative weighted Hamming distance to A, as shown in the upper right of FIG. 8. The process is repeated with the new A, which now contains two nodes. Node n2 has edge weights of 22 to A and node n3 has edge weights of 24 to A, so node $n_3$ is assigned a codeword next. As shown in the lower right of FIG. 8, node $n_3$ is assigned 11, as that minimizes the cumulative weighted sum of the bit transitions between $n_3$ and nodes {$n_1$, $n_4$} in A. Finally, the last node $n_2$ is assigned the remaining codeword, as shown in the lower left of the figure. The expected switching activity obtained for this assignment of codewords is 104 (calculated using the edge weights that are restored in the lower left graph in the figure). This is a 15% improvement over the frequency-based Assignment for the same graph, and is attributable to the interchange of the assignments of 10 and 11 to nodes $n_2$ and $n_3$ in the subject graph.

Memory Controller Architecture

Figure 4:
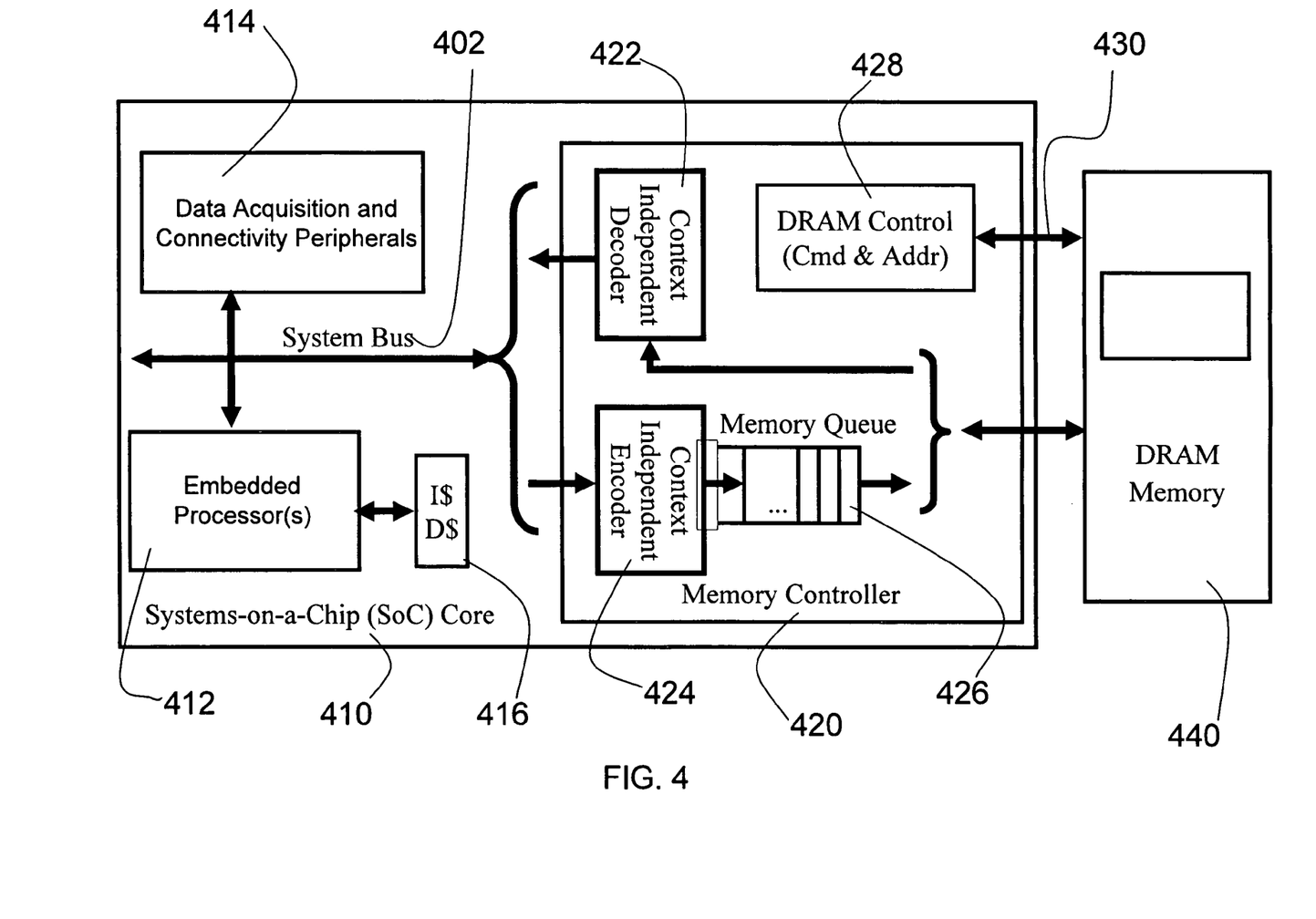
FIG. 4 is a block diagram of a memory controller architecture in accordance with a preferred embodiment of the present invention.

FIG. 4 shows the architecture of a memory controller 420 for embedded systems. Memory requests arrive on the system bus 402. At this point, if the memory request is a write, the data will be encoded by the context-independent encoder 424 before it is placed in a queue 426 within the memory controller. The SDRAM controller 428 within the memory controller then issues the appropriate commands to the SDRAM 440 in order to satisfy each pending request in the queue 426. Finally, if the memory operation is a read from the SDRAM 440, the data can be decoded by the context-independent decoder 422 before being returned to the core 410 over the system bus 402.

A context-independent codec does not need to be near the pins. Rather, the data can be encoded and decoded anywhere within the memory controller 420 because only the actual data being encoded or decoded is needed to perform the encoding or decoding. This makes it convenient to encode write data before it is placed in the memory queue, thereby minimizing any latency penalties. It is entirely possible that the latency of encoding write data can be hidden by long latency SDRAM operations that must occur before the data can cross the pins anyway. Similarly, read data can be decoded as it is sent to the system bus. Again, the decoding latency could possibly be hidden by arbitration delays for the system bus.

A context-independent codec can be implemented in multiple ways. For the trace-based codes of the present invention, a lookup-table is the most efficient mechanism. To encode or decode bytes, a 256-entry table would be required with either 8 or 9 bit entries, depending on the code. For performance, it is likely that multiple identical tables would be required, one for each byte that can be transferred on the system bus in a given cycle. To provide the flexibility to change the code, the lookup-tables would have to be SRAM structures.

The introduction of SRAM tables in the encoder and decoder will increase the total energy consumed by the system. For the frequency-based, 4-LWC code, the encoder would require four 256 entry, 9-bit wide SRAM tables to allow four bytes to be encoded per cycle. The decoder would require four 512 entry, 8-bit wide SRAM tables to allow four bytes to be decoded per cycle. Note that half of the 512 entries in the decoder tables would be unused, but a 512 entry SRAM enables a simple lookup for decoding. These tables can be approximated as 2 KB, 32-bit wide memories. An access to such a memory in 65 nm CMOS at 0.9 V would consume approximately 5.7 pJ (M. Q. Do et al., "Parameterizable architecture-level SRAM power model using circuit-simulation backend for leakage calibration," in *Proc. Intl. Symposium Quality Electronic Design*, pp. 557-563, 2006.).

To put this in perspective, a transition on a 5 mm processor memory interconnect with a 2.5 V memory would consume approximately 11 pJ. This assumes that the capacitance of the processor-memory interconnect (including the processor package traces, processor pins, board trace, memory pins, and memory package traces) is about 1.5 pF for the processor, 106 pF/m for the board trace, and 1.5 pF for the memory (W. J. Dally and J. W. Poulton, Digital Systems Engineering. Cambridge University Press, 1998.). Therefore, the proposed coding schemes must eliminate about ½ a bit transition per transfer to break even in terms of energy consumption.

Finally, many of the codes discussed here increase the size of the data by adding an additional bit for every byte. This would increase the data path width of the memory controller, the width of the processor-memory interconnect, and the width of the SDRAM. Obviously, this additional bit can increase power consumption, but the objective of these codes is to reduce power consumption by limiting the number of transitions, so usually this is not an issue in the memory controller or the processor-memory interconnect, as will be shown in Section 7 (all results include the transitions on this additional wire, as appropriate). However, widening the SDRAM is potentially problematic. Many SRAMs designed for embedded systems have 9-bit bytes. And Samsung is starting to introduce SDRAMs of that nature, as well (Samsung: 256/288 Mbit RDRAM K4R571669D/K4R881869D data sheet, version 1.4 (2002)). The wider Samsung SDRAMs consume 6-8% more current than their normal counterparts. However, this is assuming a regular data pattern. In practice, the reduction in switching activity achieved by these codes can more than offset this increase.

Simulation Infrastructure

The coding techniques presented here were evaluated using the SimpleScalar/ARM simulator (Austin, T., Larson, E., Ernst, D.: SimpleScalar: An infrastructure for computer system modeling. IEEE Computer (2002)). The simulator was configured to closely match the Intel Xscale processor (Clark, L. T., Hoffman, E. J., Miller, J., Biyani, M., Liao, Y., Strazdus, S., Morrow, M., Velarde, K. E., mark A. Yarch: An embedded 32-b microprocessor core for low-power and high-performance applications. IEEE Journal of Solid-state Circuits 36 (2001) 1599-1608). The Xscale can fetch a single instruction per cycle and issues instructions in order. Branches are predicted with a 128 entry branch target buffer and a bimodal predictor. The instruction and data caches are each 32 KB and have a single cycle access latency. The caches are configured as 32-way set associative and use a round-robin replacement policy. SimpleScalar was also modified to incorporate a cycle accurate SDRAM model so that all SDRAM accesses occur as they would in an actual system.

The SDRAM simulator accurately models the behavior of the memory controller and the SDRAM. The SDRAM model simulates all timing parameters, including command latencies, all required delays between particular commands, and refresh intervals. The memory controller within the simulator obeys all of these timing constraints when selecting commands to send to the SDRAM, thereby accurately representing the sequence of data transferred over the processor-memory interconnect. The simulator is configured to model a 75 MHz, 512 Mb Micron MT48LC32M16A2-75 single data rate SDRAM (Micron: 512 Mb: x4, x8, x16 SDRAM MT48LC32M16A2 data sheet (2004)).

The bit transitions on the interconnect for the encoded and unencoded data transfers was calculated as the SDRAM is accessed. This faithfully models the bit transitions that would occur on the data bus in the appropriate order.

The MiBench embedded benchmark suite was used to evaluate the proposed coding techniques (Guthaus, M. R., Ringenberg, J. S., Ernst, D., Austin, T. M., Mudge, T., Brown, R. B.: MiBench: A free, commercially representative embedded benchmark suite. In: IEEE 4th Annual Workshop on Workload Characterization. (2001)). Thirty applications are used from the suite with their large input sets. While still small, the large inputs are more representative of actual workloads. The applications span the automotive, consumer, networking, office, security, and telecomm domains.

Results

The coding techniques presented here were evaluated using the SimpleScalar/ARM simulator (T. Austin, E. Larson, and D. Ernst, "SimpleScalar: An infrastructure for computer system modeling," IEEE Computer, vol. 35, February 2002.). The simulator was configured to closely match the Intel Xscale processor (L. T. Clark et al., "An embedded 32-b microprocessor core for low power and high-performance applications," IEEE Journal of Solidstate Circuits, vol. 36, no. 11, pp. 1599-1608, 2001.). SimpleScalar was also modified to incorporate a cycle accurate SDRAM model that simulates all timing and resource constraints. The simulator is configured to model a 75 MHz, 512 MbMicronMT48LC32M16A2-75 single data rate SDRAM.

The switching activity on the interconnect for the coded and uncoded data transfers was calculated as the SDRAM is accessed. This faithfully models the switching activity, i.e., the bit transitions that would occur on the data bus in the appropriate order.

The MiBench embedded benchmark suite was used to evaluate the proposed codes. Thirty applications, spanning the automotive, consumer, networking, office, security, and telecommunication domains, are used from the suite with their large input sets.

Table 2 shows the average reduction in switching activity on the processor-memory interconnect for thirteen coding strategies when compared with the baseline uncoded case. The table shows the bus width for each coding strategy (switching activity on any additional wires are accounted for in all results), the average switching activity per transfer, and the reduction in switching activity compared to the uncoded case. The first two codes in the table are context-dependent, double-ended codes. Bus-invert coding is the simplest and most popular such code. FV32 with a decorrelator one-hot codes the 32 most frequently occurring values (for each benchmark) and uses a decorrelator to significantly reduce switching activity. As the table shows, both context-dependent, double-ended codes perform quite well, reducing switching activity on the interconnect by 21.8% and 38.7%, respectively.

The remaining eleven codes are all context-independent, single-ended codes that can be implemented entirely within the memory controller without specialized SDRAM. FV32 and FV8 are modified from the codes presented in to make them single-ended. They simply one-hot encode the 32 most frequently occurring word values or the eight most frequently occurring byte values to form a code. These codes are labeled "Self", as each benchmark uses the most frequently occurring values from that benchmark. As the table shows, these codes yield only a 17.8% and 15.5% reduction in switching activity. Therefore, such a one-hot encoding strategy relies heavily on a context-dependent, double-ended decorrelator to reduce switching activity on the interconnect.

4-LWC is the original limited-weight code, presented in Section 2.1, which uses nine bits per byte to code all byte values with at most four bits set. Without using trace-based assignment, 4-LWC is only able to reduce switching activity by 13.9%.

The next four limited-weight codes use the frequency-based assignment scheme of the present invention. "Self" and "Global" refer to whether each benchmark's own frequency distributions were used to assign codewords for that benchmark or all benchmarks used the same codewords derived from the combined frequency distributions of all benchmarks. The 8-LWC is equivalent to remapping, and uses eight bits per byte. The 4-LWC uses nine bits per byte. As the table shows, these codes are able to reduce switching activity on the interconnect by 22.4-30.3% on average. As would be expected, the codes that use the frequency distributions for each benchmark individually yield about 5-6% higher reductions.

The last four limited-weight codes use the sequence-based assignment scheme of the present invention. Similar to frequency-based coding, "Self" and "Global" refer to the use of self or global transition frequency distributions for codeword assignment. The codewords for the 8-LWC and 4-LWC schemes are equivalent to those for the frequency-based mapping technique. As the table shows, these codes are able to reduce switching activity on the interconnect by 33.3-42.5% on average. As would be expected, the codes which use the transition frequency distributions for each benchmark individually yield higher reductions, by about 7-8%.

The results show that when using limited-weight codes, the assignment strategy is critical. Furthermore, the penalty of using an extra wire per byte for the 4-LWC codes is more than offset by the effectiveness of such codes. Finally, these codes reduce the number of bit transitions per transfer by 2.7-5.1, indication that the energy savings achieved by eliminating this many bit transitions per transfer dwarfs the minor energy overhead (~0.5 bit transitions per transfer) of implementing the SRAM-based lookup tables to support such codes in hardware.

TABLE 2

Average reduction in switching activity

| | | Code | Bus Width | Bit Transitions per Transfer | Reduction (%) |
|---|---|---|---|---|---|
| | | Uncoded | 32 | 11.95 | — |
| Context-dependent | Prior work | Bus Invert ([24]) | 36 | 9.35 | 21.8 |
| Double-ended | | Self FV32 with Decorrelator ([15]) | 33 | 7.33 | 38.7 |
| Context-independent | Prior work | Self FV32 (modified from [15]) | 33 | 9.82 | 17.8 |
| Single-ended | | Self FV8 (modified from [15]) | 36 | 10.10 | 15.5 |
| | | 4-LWC ([25]) | 36 | 10.29 | 13.9 |
| | Frequency-based Assignment | Self 8-LWC | 32 | 8.58 | 28.2 |
| | | Global 8-LWC | 32 | 9.27 | 22.4 |
| | | Self 4-LWC | 36 | 8.32 | 30.3 |
| | | Global 4-LWC | 36 | 8.94 | 25.1 |
| | Sequence-based Assignment | Self 8-LWC | 32 | 6.99 | 41.5 |
| | | Global 8-LWC | 32 | 7.97 | 33.3 |
| | | Self 4-LWC | 36 | 6.87 | 42.5 |
| | | Global 4-LWC | 36 | 7.71 | 35.5 |

While the preferred embodiments have been described in the context of a memory controller on an SoC, the present invention may be used in memory controllers in other contexts.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for controlling a commodity memory to reduce energy consumption by interconnects between a processor and said commodity memory, the method comprising the steps of:

generating a set of codewords in a memory controller;

assigning a unique codeword from said generated set of codewords in said memory controller to each information symbol in a set of information symbols based upon frequency metrics without using any local context information to product context independent single-ended mapping between said generated set of codewords and said set of information symbols;

encoding information symbols to codewords using said context independent single-ended mapping in said memory controller;

storing said encoded information symbols in said commodity memory;

retrieving said encoded information symbols from said commodity memory; and decoding said encoded information symbols in said memory controller using said context independent single-ended mapping.

2. A method for controlling a commodity memory according to claim 1 wherein said assigning of codewords is based upon memory traces from a system.

3. A method for controlling a commodity memory according to claim 2 wherein said assigning of codewords is determined by frequency-based metrics applied to said memory traces and said codewords are limited-weight codewords.

4. A method for controlling a commodity memory according to claim 3 wherein said frequency-based metrics comprise encoding information symbols with the highest frequency of occurrence to the least-weight codewords.

5. A method for controlling a commodity memory according to claim 2 wherein said assigning of codewords is determined by sequence-based metrics applied to said memory traces and said codewords are limited-weight codewords.

6. A method for controlling a commodity memory according to claim 5 wherein said sequence-based metrics comprise encoding information symbols that most frequently occur in sequence to the least-weight codewords that are also separated by the minimum Hamming distance.

7. A method for controlling a commodity memory according to claim 1 wherein said assigning of codewords is determined by frequency-based metrics and said codewords are limited-weight codewords.

8. A method for controlling a commodity memory according to claim 7 wherein said frequency-based metrics comprise encoding information symbols with the highest frequency of occurrence to the least-weight codewords.

9. A method for controlling a commodity memory according to claim 1 wherein said assigning of codewords is determined by sequence-based metrics and said codewords are limited-weight codewords.

10. A method for controlling a commodity memory according to claim 9 wherein said sequence-based metrics comprise encoding information symbols that most frequently occur in sequence to the least-weight codewords that are also separated by the minimum Hamming distance.

11. A system comprising:

a commodity memory; and a memory controller connected to said commodity memory, said memory controller comprising:

a context-independent encoder;

a context-independent decoder; and a memory queue for providing data from said context-independent encoder to said commodity memory;

wherein said context-independent encoder encodes information symbols into codewords using a context-independent single-ended mapping and provides encoded data to said memory queue and said context-independent decoder decodes codewords received from said commodity memory that previously were encoded by said context-independent encoder.

12. A system according to claim 11 wherein said codewords are limited-weight codewords generated using frequency-based metrics.

13. A system according to claim 12 wherein said frequency-based metrics are determined using memory traces from a system.

14. A system according to claim 11 wherein said codewords are limited-weight codewords generated using sequence-based metrics.

15. A system according to claim 14 wherein said sequence-based metrics are determined using memory traces from a system.

* * * * *